United States Patent
Nagaoka et al.

(10) Patent No.: US 11,371,161 B2
(45) Date of Patent: *Jun. 28, 2022

(54) METHOD OF FORMING OXIDE FILM, METHOD OF MANUFACTURING SEMICONDUCTOR DEVICE, AND FILM FORMING APPARATUS CONFIGURED TO FORM OXIDE FILM

(71) Applicants: DENSO CORPORATION, Kariya (JP); NATIONAL UNIVERSITY CORPORATION KYOTO INSTITUTE OF TECHNOLOGY, Kyoto (JP)

(72) Inventors: Tatsuji Nagaoka, Nagakute (JP); Hiroyuki Nishinaka, Kyoto (JP); Masahiro Yoshimoto, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/892,793

(22) Filed: Jun. 4, 2020

(65) Prior Publication Data
US 2020/0385884 A1 Dec. 10, 2020

(30) Foreign Application Priority Data
Jun. 5, 2019 (JP) .............................. JP2019-105350

(51) Int. Cl.
*C30B 19/06* (2006.01)
*C30B 19/10* (2006.01)
(Continued)

(52) U.S. Cl.
CPC ............ *C30B 19/106* (2013.01); *C30B 19/06* (2013.01); *C30B 29/16* (2013.01); *H01L 21/02565* (2013.01); *H01L 21/02628* (2013.01)

(58) Field of Classification Search
CPC ....... C30B 29/16; C30B 19/06; C30B 19/106; H01L 21/02565; H01L 21/02628
See application file for complete search history.

(56) References Cited

U.S. PATENT DOCUMENTS

2016/0222511 A1* 8/2016 Sasaki ............... C23C 16/45508
2017/0033237 A1 2/2017 Abe et al.
(Continued)

FOREIGN PATENT DOCUMENTS

| JP | 2013-028480 A | 2/2013 |
| JP | 2013-140201 A | 7/2013 |

(Continued)

OTHER PUBLICATIONS

Liu Yaodong, "Zinc oxide film", National Defense Industry Press, Aug. 31, 2013, pp. 48-49, (5 pages).
(Continued)

*Primary Examiner* — Robert M Kunemund
(74) *Attorney, Agent, or Firm* — Sughrue Mion, PLLC

(57) ABSTRACT

A method of forming an oxide film is provided. The method may include: supplying mist of a solution including a material of the oxide film dissolved therein to a surface of a substrate while heating the substrate at a first temperature so as to epitaxially grow the oxide film on the surface; and bringing the oxide film into contact with a fluid comprising oxygen atoms while heating the oxide film at a second temperature higher than the first temperature after the epitaxial growth of the oxide film.

11 Claims, 3 Drawing Sheets

(51) Int. Cl.
H01L 21/02 (2006.01)
C30B 29/16 (2006.01)

(56) References Cited

U.S. PATENT DOCUMENTS

2017/0278706 A1* 9/2017 Oda .................. H01L 29/66969
2018/0240864 A1* 8/2018 Nagaoka ........... H01L 29/66212

FOREIGN PATENT DOCUMENTS

JP  2015-070248 A  4/2015
JP  2017-195355 A  10/2017

OTHER PUBLICATIONS

Huang Xiao-jun et al., "Research progress of the preparation of gallium oxide photocatalyst and its application in water treatment", Applied Chemical Industry, vol. 47 No. 8, Aug. 31, 2018, pp. 1715-1718, (6 pages).
Zhengzheng Ma, et al., "Influence of Annealing on Properties of $Ga_2O_3$ Thin Films", Chinese Journal of Luminescence, vol. 38, No. 5, pp. 607-608, May 2017 (10 pages total).

* cited by examiner

METHOD OF FORMING OXIDE FILM, METHOD OF MANUFACTURING SEMICONDUCTOR DEVICE, AND FILM FORMING APPARATUS CONFIGURED TO FORM OXIDE FILM

TECHNICAL FIELD

The technology herein disclosed relates to a method of forming an oxide film, a method of manufacturing a semiconductor device, and a film forming apparatus configured to form an oxide film.

BACKGROUND

Japanese Patent Application Publication No. 2015-070248 describes a method of forming an oxide film. In this film forming method, mist of a solution including a material of the oxide film dissolved therein is supplied to a surface of a substrate. The mist adheres to the surface of the substrate, and then the oxide film is epitaxially grown on the surface of the substrate.

SUMMARY

In a case of epitaxially growing an oxide film by using mist, the oxide film is formed at a higher rate when the substrate is at a lower temperature. On the other hand, in the film forming method using the mist, if the oxide film is epitaxially grown at a low temperature, oxygen vacancies (defects in which oxygen-atom sites are vacant for lack of oxygen atoms) are easily formed in a crystal of the oxide film to be epitaxially grown. As a result of this, the oxide film has a low crystallinity. As such, conventional technologies have a problem that an oxide film formed at a higher film forming rate has a lower crystallinity. The disclosure herein proposes a technology configured to form an oxide film having a high crystallinity within a short time.

The method disclosed herein relates to a method of forming an oxide film. The method may comprise a first process and a second process. The first process may comprise supplying mist of a solution including a material of the oxide film dissolved therein to a surface of a substrate while heating the substrate at a first temperature so as to epitaxially grow the oxide film on the surface. The second process may comprise bringing the oxide film into contact with a fluid comprising oxygen atoms while heating the oxide film at a second temperature higher than the first temperature after the epitaxial growth of the oxide film.

Examples of the above-described fluid include gas, mist, or the like.

As a first process of this film forming method, the oxide film is epitaxially grown on the surface of the substrate at the first temperature which is relatively low by using the film forming method using the mist. In the first process, the oxide film is thus grown at a relatively high film forming rate. The oxide film can thus be formed within a short time. In the second process, the oxide film is brought into contact with the fluid containing oxygen atoms. In the second process, since the oxide film is heated at the second temperature higher than the first temperature, the oxygen atoms easily diffuse into the oxide film. The oxygen atoms thus diffuse from the fluid into the oxide film, and oxygen vacancies in the oxide film are filled with the oxygen atoms. This decreases an amount of the oxygen vacancies and improves crystallinity of the oxide film. The second process can therefore decrease the amount of oxygen vacancies in the oxide film and improve the crystallinity of the oxide film. As described above, this film forming method enables an oxide film having a high crystallinity to be formed within a short time.

DETAILED DESCRIPTION

First Embodiment

Figure 1:
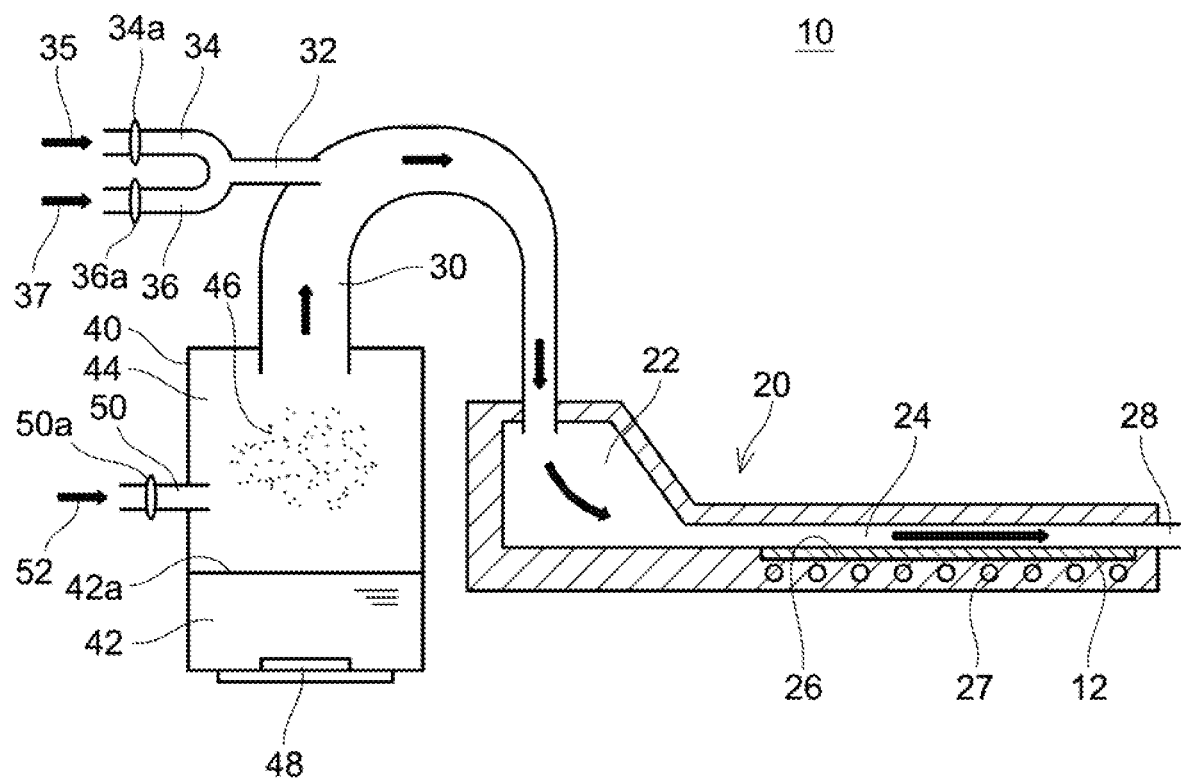
FIG. 1 is a diagram showing a configuration of a film forming apparatus in a first embodiment.

A film forming apparatus 10 shown in FIG. 1 is an apparatus configured to epitaxially grow a gallium oxide film on a surface of a substrate 12. The gallium oxide film is a semiconductor film. The film forming apparatus 10 is used for manufacturing a semiconductor device that includes the gallium oxide film. The film forming apparatus 10 comprises a furnace 20 and a reservoir 40.

The reservoir 40 is an enclosed container. The reservoir 40 stores a solution 42 including water ($H_2O$) and a raw material of the gallium oxide film dissolved in the water. There is a space 44 between a surface 42a of the solution 42 and an upper surface of the reservoir 40. An ultrasonic transducer 48 is arranged at a bottom surface of the reservoir 40. The ultrasonic transducer 48 is configured to apply ultrasound to the solution 42 stored in the reservoir 40. When the ultrasound is applied to the solution 42, the surface 42a of the solution 42 vibrates, by which mist of the solution 42 (hereinafter termed solution mist 46) is generated into the space 44 above the solution 42. The upper surface of the reservoir 40 is connected to an upstream end of a mist supply path 30. An outer peripheral wall of the reservoir 40 is connected to a downstream end of a carrier gas supply path 50. An upstream end of the carrier gas supply path 50 is connected to a carrier gas supply source (not shown). The carrier gas supply path 50 includes a valve 50a. When the valve 50a is opened, a first carrier gas 52 is introduced from the carrier gas supply source into the space 44 in the reservoir 40 via the carrier gas supply path 50. The first carrier gas 52 is an inert gas. The first carrier gas 52 has an oxygen ($O_2$) concentration equal to or less than 21 vol %. More specifically, the first carrier gas 52 contains no oxygen. The first carrier gas 52 introduced from the carrier gas supply path 50 into the space 44 flows from the space 44 to the mist supply path 30. At this time, the solution mist 46 in the space 44 flows to the mist supply path 30 together with the first carrier gas 52.

A downstream end of a gas supply path 32 is connected to a point in the mist supply path 30. An upstream end of the gas supply path 32 is connected to a carrier gas supply path 34 and an oxygen gas supply path 36. An upstream end of the carrier gas supply path 34 is connected to a carrier gas supply source (not shown). The carrier gas supply path 34 includes a valve 34a. When the valve 34a is opened, a second carrier gas 35 is introduced from the carrier gas supply source into the mist supply path 30 via the carrier gas supply path 34 and the gas supply path 32. The second carrier gas 35 is an inert gas. The second carrier gas 35 has an oxygen concentration equal to or less than 21 vol %. More specifically, the second carrier gas 35 contains no oxygen. An upstream end of the oxygen gas supply path 36 is connected to an oxygen gas supply source (not shown). The oxygen gas supply path 36 includes a valve 36a. When the valve 36a is opened, oxygen gas 37 (i.e., $O_2$) is introduced from the oxygen gas supply source into the mist supply path 30 via the oxygen gas supply path 36 and the gas supply path 32. A partial pressure of oxygen ($O_2$) in the oxygen gas 37 is higher than a partial pressure of oxygen ($O_2$) in an atmosphere.

The furnace 20 includes an intake portion 22, and a channel 24 in communication with the intake portion 22. The intake portion 22 has a higher height and the channel 24 has a lower height. The intake portion 22 is connected to a downstream end of the mist supply path 30. An ejection pipe 28 is connected to an end of the channel 24. A substrate stage 26 is disposed at a lower surface of the channel 24. The substrate stage 26 is configured to have the substrate 12 mounted thereon. A heater 27 is disposed within the substrate stage 26 (i.e., within an outer wall of the furnace 20). The heater 27 is configured to heat the substrate 12.

Next, a film forming method using the film forming apparatus 10 will be described. Here, a sapphire substrate is used as the substrate 12, and an α-gallium oxide ($Ga_2O_3$) semiconductor film is grown on the substrate 12. An aqueous solution containing water having a gallium compound (e.g., gallium acetylacetonate, gallium chloride) dissolved therein is used as the solution 42. Further, a tin(II) compound which is a dopant material has been dissolved in the solution 42 to add tin as dopants to the gallium oxide. Argon (Ar) is used as the first carrier gas 52 and the second carrier gas 35.

Firstly, the substrate 12 is set on the substrate stage 26. After the substrate 12 has been set, a film forming process and an oxygen annealing process are performed.

Firstly, the film forming process is performed. In the film forming process, firstly the substrate 12 is heated with the heater 27. Here, a temperature of the substrate 12 is controlled to be 350 to 500° C. When the temperature of the substrate 12 has stabilized, the ultrasonic transducer 48 is activated to generate the solution mist 46 into the space 44 in the reservoir 40. In doing this, the valve 50a is opened to introduce the first carrier gas 52 from the carrier gas supply path 50 into the reservoir 40. The solution mist 46 then flows into the mist supply path 30 together with the first carrier gas 52. Further, the valve 34a is opened to introduce the second carrier gas 35 from the gas supply path 32 into the mist supply path 30. As a result of this, the solution mist 46 is diluted within the mist supply path 30. The solution mist 46 flows into the furnace 20 together with the first carrier gas 52 and the second carrier gas 35. The solution mist 46 flows from the intake portion 22 to the channel 24 together with the first carrier gas 52 and the second carrier gas 35, and is ejected to the ejection pipe 28. While the solution mist 46 is flowing within the channel 24, a part of the solution mist 46 adheres to the surface of the substrate 12. Since the substrate 12 has been heated with the heater 27, a chemical reaction of the solution mist 46 (i.e., the solution 42) takes place on the substrate 12. As a result of this, α-gallium oxide is generated on the substrate 12. The solution mist 46 is continuously supplied to the surface of the substrate 12, and accordingly a gallium oxide film (semiconductor film) is grown on the surface of the substrate 12. A single-crystal gallium oxide film is epitaxially grown on the surface of the substrate 12. The gases supplied to the furnace 20 (i.e., the first carrier gas 52 and the second carrier gas 35) have a low oxygen content, and thus the solution mist 46 is less likely to be oxidized. More specifically, the gallium oxide compound and the dopant material both contained in the solution mist 46 is more difficult to oxidize. This suppresses oxide dusts from adhering to the surface of the growing gallium oxide film. In the meantime, since the temperature of the substrate 12 in the film forming process is low, oxygen vacancies are easily formed within the gallium oxide film while the gallium oxide film is grown. The gallium oxide film having many oxygen vacancies is therefore formed. Moreover, since the solution 42 contains the dopant material, the dopants (tin) are captured into the gallium oxide film. The gallium oxide film of an n-type is thus formed. After the gallium oxide film has been formed, the ultrasonic transducer 48 is stopped and the valves 34a, 50a are closed to stop the supply of the solution mist 46 to the substrate 12.

Next, the oxygen annealing process is performed. In the oxygen annealing process, firstly the substrate 12 is heated with the heater 27. Here, the temperature of the substrate 12 and the gallium oxide film is controlled to be 550° C. or approximately 550° C. In other words, in the oxygen annealing process, the substrate 12 and the gallium oxide film are heated at a temperature higher than the temperature of the substrate 12 in the film forming process. When the temperature of the substrate 12 has stabilized, the valve 36a is opened. The oxygen gas 37 then flows from the oxygen gas supply path 36 into the furnace 20 via the gas supply path 32 and the mist supply path 30. Here, the oxygen gas 37 is supplied at a flow rate of 0.5 L/min. The oxygen gas 37 passes through the intake portion 22 and the channel 24, and is ejected to the ejection pipe 28. Since the oxygen gas 37 flows through the channel 24, the gallium oxide film on the substrate 12 is brought into contact with the oxygen gas 37. Oxygen atoms then diffuse from the oxygen gas 37 into the gallium oxide film. The oxygen atoms that have diffused into the gallium oxide film enter into the oxygen vacancies in the gallium oxide film. The oxygen vacancies are filled with the oxygen atoms and hence are eliminated. Since the temperature of the gallium oxide film is high in the oxygen annealing process, the oxygen vacancies in the gallium oxide film are easily filled with the oxygen atoms. Further, since the partial pressure of oxygen ($O_2$) in the oxygen gas 37 is higher than the partial pressure of oxygen ($O_2$) in the atmosphere, the oxygen vacancies are easier to be filled with oxygen. Many of the oxygen vacancies therefore are eliminated in the gallium oxide film. The oxygen vacancies in the gallium oxide film thereby decrease at a great degree. Therefore, the gallium oxide film having a high crystallinity can be obtained.

In the film forming method in the first embodiment, as described above, the temperature of the substrate 12 and the gallium oxide film in the oxygen annealing process is controlled to be higher than the temperature of the substrate 12 in the film forming process. Since the temperature of the substrate 12 in the film forming process is low, the gallium oxide film can be epitaxially grown at a high film forming rate in the film forming process. The gallium oxide film can thus be formed within a short time. Since the temperature of the substrate 12 and the gallium oxide film is high in the oxygen annealing process, oxygen atoms easily enter into the oxygen vacancies in the gallium oxide film. The gallium oxide film having a high crystallinity can therefore be obtained. As such, this manufacturing method enables a gallium oxide film having a high crystallinity to be formed within a short time.

As mentioned above, the film forming method in the first embodiment enables a gallium oxide film having few oxygen vacancies to be formed. The gallium oxide film is a semiconductor, and the oxygen vacancies in the gallium oxide film function as donors of an n-type. This film forming method can suppress manufacturing variation in a carrier density of the gallium oxide film by decreasing a density of the oxygen vacancies in the gallium oxide film. Characteristics of the gallium oxide film can thus be controlled accurately.

In the film forming process of the first embodiment, the solution mist 46 containing the dopant material (tin(II) compound) is supplied to the surface of the substrate 12. The dopants (tin) are thus captured into the gallium oxide film, and the gallium oxide film of the n-type is formed. Since the temperature of the substrate 12 and the gallium oxide film in the film forming process is low, the dopants are easily captured into the gallium oxide film. Therefore, this film forming method enables a gallium oxide film having a high dopant concentration to be formed.

In the film forming method of the first embodiment, the film forming process and the oxygen annealing process are performed in a same furnace 20. The gallium oxide film is thus not brought into contact with the atmosphere external to the furnace 20 during transition from the film forming process to the oxygen annealing process. This can prevent unintended atoms from entering into the oxygen vacancies.

In the above-mentioned film forming method of the first embodiment, the oxygen gas 37 is not supplied into the furnace 20 in the film forming process. However, alternatively the oxygen gas 37 may be supplied into the furnace 20 in the film forming process. In other words, the oxygen gas 37 may be supplied continuously into the furnace 20 from the film forming process through the oxygen annealing process. It should be noted that, since the temperature of the substrate 12 in the film forming process is relatively low, the oxygen atoms are difficult to be captured from the oxygen gas 37 into the gallium oxide film in the film forming process. In other words, in the film forming process, even the supply of the oxygen gas 37 into the furnace 20 does not much contribute to decreasing the oxygen vacancies. However, in the oxygen annealing process that takes place after the film forming process, the oxygen vacancies can be decreased by filling the oxygen atoms therein.

Second Embodiment

Figure 2:
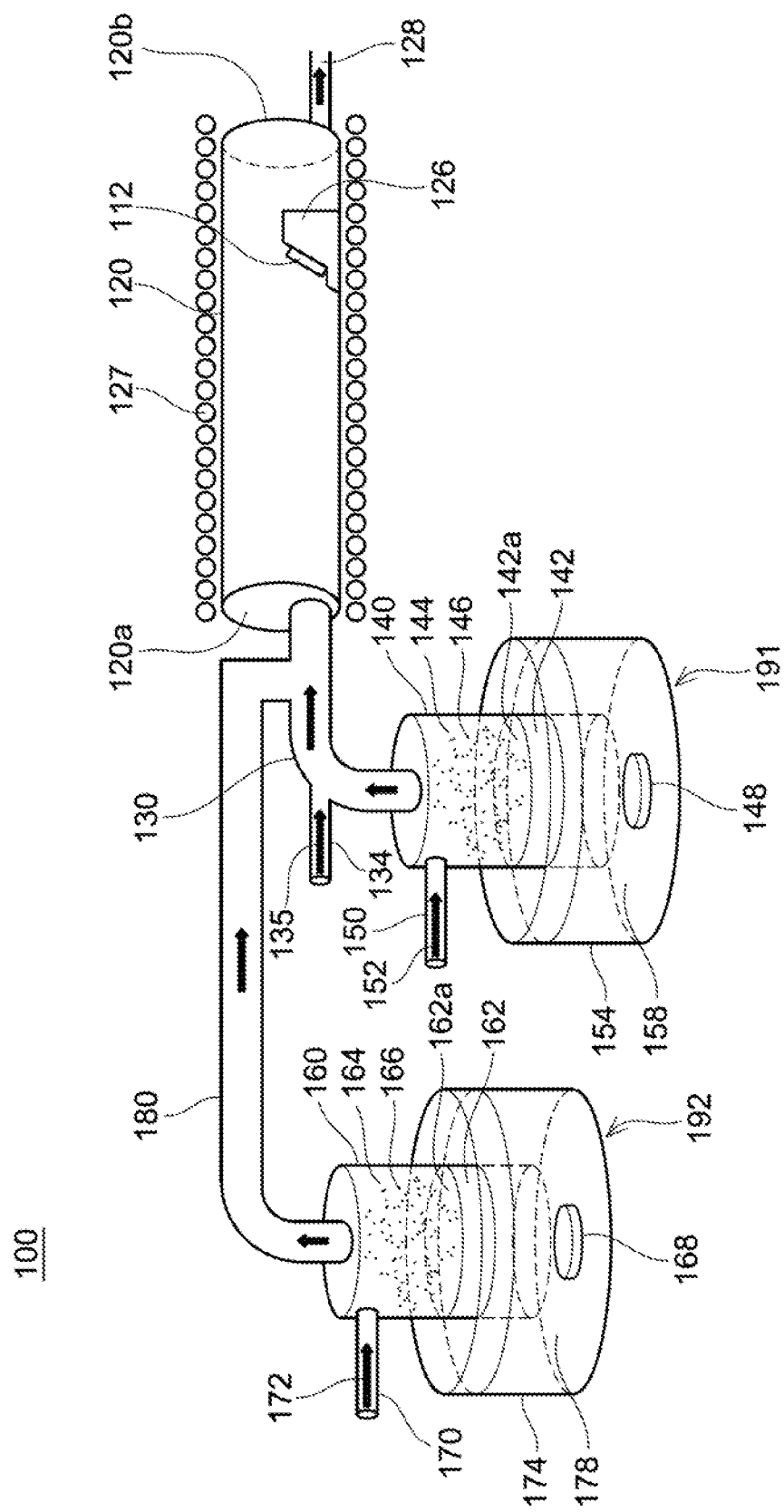
FIG. 2 is a diagram showing a configuration of a film forming apparatus in a second embodiment.

A film forming apparatus 100 in a second embodiment shown in FIG. 2 is an apparatus configured to epitaxially grow a gallium oxide film on a surface of a substrate 112. The film forming apparatus 100 is used for manufacturing a semiconductor device including the gallium oxide film. The film forming apparatus 100 comprises a first mist supply device 191, a second mist supply device 192, and a furnace 120.

The furnace 120 is a tubular furnace extending from an upstream end 120a to a downstream end 120b. A downstream end of a solution mist supply path 130 is connected to the upstream end 120a of the furnace 120. The downstream end 120b of the furnace 120 is connected to an ejection pipe 128. The furnace 120 includes a substrate stage 126 therein configured to support the substrate 112. The substrate stage 126 is configured to have the substrate 112 be inclined relative to a longitudinal direction of the furnace 120. A heater 127 is disposed along an outer peripheral wall of the furnace 120. The heater 127 is configured to heat the outer peripheral wall of the furnace 120, which in turn heats the substrate 112 in the furnace 120.

The first mist supply device 191 comprises a reservoir 140, a water tank 154, and an ultrasonic transducer 148. The reservoir 140 is an enclosed container. The reservoir 140 stores a solution 142 containing water ($H_2O$) and a raw material of the gallium oxide film dissolved in the water. There is a space 144 between a surface 142a of the solution 142 and an upper surface of the reservoir 140. A film constitutes a bottom surface of the reservoir 140. The water tank 154 is a container with its top opened, and stores water 158 therein. The reservoir 140 has its bottom immersed in the water 158 in the water tank 154. The ultrasonic transducer 148 is arranged at a bottom surface of the water tank 154, and is configured to apply ultrasonic vibration to the water 158 in the water tank 154. When the ultrasonic transducer 148 applies ultrasonic vibration to the water 158 in the water tank 154, the ultrasonic vibration is transferred to the solution 142 via the water 158. The surface 142a of the solution 142 then vibrates, thus mist of the solution 142 (hereinafter termed solution mist 146) is generated into the space 144 above the solution 142.

The upper surface of the reservoir 140 is connected to an upstream end of the solution mist supply path 130. An outer peripheral wall of the reservoir 140 is connected to a downstream end of a carrier gas supply path 150. An upstream end of the carrier gas supply path 150 is connected to a carrier gas supply source (not shown). A first carrier gas 152 is supplied from the carrier gas supply source to the carrier gas supply path 150. The first carrier gas 152 is introduced into the space 144 in the reservoir 140 via the carrier gas supply path 150. The first carrier gas 152 is an inert gas. The first carrier gas 152 has an oxygen concentration equal to or less than 21 vol %. More specifically, the first carrier gas 152 contains no oxygen. The first carrier gas 152 that has been introduced from the carrier gas supply path 150 into the space 144 flows from the space 144 to the solution mist supply path 130. At this occasion, the solution mist 146 in the space 144 flows to the solution mist supply path 130 together with the first carrier gas 152.

The downstream end of the solution mist supply path 130 is connected to the upstream end 120a of the furnace 120. A downstream end of a carrier gas supply path 134 is connected to a point in the solution mist supply path 130. An upstream end of the carrier gas supply path 134 is connected to a carrier gas supply source (not shown). A second carrier gas 135 is supplied from the carrier gas supply source to the carrier gas supply path 134. The second carrier gas 135 that has flowed into the carrier gas supply path 134 flows into the solution mist supply path 130. The solution mist 146 is therefore diluted in the solution mist supply path 130. The second carrier gas 135 is an inert gas. The second carrier gas 135 has an oxygen concentration equal to or less than 21 vol %. More specifically, the second carrier gas 35 contains no oxygen. The solution mist 146 flows in the solution mist supply path 130 to its downstream end together with the second carrier gas 135 and the first carrier gas 152, and flows into the furnace 120.

The second mist supply device 192 comprises a reservoir 160, a water tank 174, and an ultrasonic transducer 168. The reservoir 160 is an enclosed container. The reservoir 160 stores water (more specifically, pure water ($H_2O$)) 162. There is a space 164 between a surface 162a of the water 162 and an upper surface of the reservoir 160. A film constitutes a bottom surface of the reservoir 160. The water tank 174 is a container with its top opened, and stores water 178 therein. The reservoir 160 has its bottom sunk in the water 178 in the water tank 174. The ultrasonic transducer 168 is arranged at a bottom surface of the water tank 174, and is configured to apply ultrasonic vibration to the water 178 in the water tank 174. When the ultrasonic transducer 168 applies ultrasonic vibration to the water 178 in the water tank 174, the ultrasonic vibration is transferred to the water 162 via the water 178. The surface 162a of the water 162 then vibrates, thus mist of the water 162 (hereinafter termed water mist 166) is generated into the space 164 above the water 162.

An upstream end of a water mist supply path 180 is connected to the upper surface of the reservoir 160. A downstream end of the water mist supply path 180 is connected to the upstream end 120a of the furnace 120 via the solution mist supply path 130. A downstream end of an oxygen gas supply path 170 is connected to an outer peripheral wall of the reservoir 160. An upstream end of the oxygen gas supply path 170 is connected to an oxygen gas supply source (not shown). Oxygen gas 172 is supplied from the oxygen gas supply source to the oxygen gas supply path 170. The oxygen gas 172 is introduced into the space 164 in the reservoir 160 via the oxygen gas supply path 170. The oxygen gas 172 that has been introduced from the oxygen gas supply path 170 into the space 164 flows from the space 164 to the water mist supply path 180. At this occasion, the water mist 166 in the space 164 flows to the water mist supply path 180 together with the oxygen gas 172. The water mist 166 that has flowed to the water mist supply path 180 flows into the furnace 120 together with oxygen gas 172.

Next, a film forming method using the film forming apparatus 100 will be described. Here, a substrate constituted of a single crystal of β-gallium oxide is used as the substrate 112. A β-gallium oxide semiconductor film is epitaxially grown on the substrate 112. An aqueous solution containing water and a gallium compound (e.g., gallium chloride) dissolved in the water is used as the solution 142. Further, ammonium fluoride (NH$_4$F) which is a dopant material has been dissolved in the solution 142 to add fluorine as dopants to the gallium oxide film. Nitrogen is used as the first carrier gas 152 and the second carrier gas 135.

Firstly, the substrate 112 is set on the substrate stage 126. After the substrate 112 has been set, a film forming process and a water mist annealing process are performed.

Firstly, the film forming process is performed. In the film forming process, firstly, the substrate 112 is heated with the heater 127. Here, a temperature of the substrate 112 is controlled to be 750° C. or approximately 750° C. When the temperature of the substrate 112 has stabilized, the ultrasonic transducer 148 is activated to generate the solution mist 146 into the space 144 in the reservoir 140. The first carrier gas 152 is introduced from the carrier gas supply path 150 into the reservoir 140. Here, the first carrier gas 152 is controlled to flow at a flow rate of 5 L/min. The solution mist 146 then flows into the solution mist supply path 130 together with the first carrier gas 152. Further, the second carrier gas 135 is introduced from the carrier gas supply path 134 into the solution mist supply path 130. Here, the second carrier gas 135 is controlled to flow at a flow rate of 5 L/min. As a result of this, the solution mist 146 is diluted in the solution mist supply path 130. The solution mist 146 flows into the furnace 120 together with the first carrier gas 152 and the second carrier gas 135. The solution mist 146 flows through the furnace 120 from the upstream end 120a to the downstream end 120b together with the first carrier gas 152 and the second carrier gas 135, and is ejected to the ejection pipe 128. The substrate 112 supported by the substrate stage 126 is supported in an orientation that allows the solution mist 146 flowing through the furnace 120 from the upstream end 120a toward the downstream end 120b to be applied to the surface of the substrate 112. In doing this, a part of the solution mist 146 adheres to the surface of the substrate 112. Since the substrate 112 has been heated with the heater 127, a chemical reaction of the solution mist 146 (i.e., the solution 142) takes place on the substrate 112. As a result of this, β-gallium oxide is generated on the substrate 112. The solution mist 146 is continuously supplied to the surface of the substrate 112, and thus a single-crystal β-gallium oxide film (semiconductor film) is epitaxially grown on the surface of the substrate 112. This condition enables the gallium oxide film to be grown at a rate equal to or more than 1 μm/hour (more specifically, a rate of 1.8 μm/hour or approximately 1.8 μm/hour). The gases that flow into the furnace 120 (i.e., the first carrier gas 152 and the second carrier gas 135) have a low oxygen content, and thus the solution mist 146 is more difficult to oxidize. More specifically, the gallium oxide compound and the dopant material both contained in the solution mist 146 are more difficult to oxidize. This suppresses oxide dusts from adhering to the surface of the growing gallium oxide film. Since the temperature of the substrate 112 in the film forming process is low, oxygen vacancies are easily formed in the gallium oxide film while the gallium oxide film is being grown. The gallium oxide film having many oxygen vacancies is therefore formed. In particular, growing the gallium oxide film at a high film forming rate (i.e., a rate equal to or more than 1 μm/hour) as described above forms many oxygen vacancies. Since the solution 142 contains the dopant material, the dopants (fluorine) are captured into the gallium oxide film. The gallium oxide film of an n-type is thus grown. After the gallium oxide film has been formed, the ultrasonic transducer 148 is stopped to stop the supply of the first carrier gas 152 and the second carrier gas 135.

Next, the water mist annealing process is performed. In the water mist annealing process, firstly the substrate 112 is heated by the heater 127. Here, the temperature of the substrate 112 and the gallium oxide film is controlled to be 800° C. or approximately 800° C. In other words, in the water mist annealing process, the substrate 112 and the gallium oxide film are heated at a temperature higher than the temperature of the substrate 112 in the film forming process. When the temperature of the substrate 112 has stabilized, the ultrasonic transducer 168 is activated to generate the water mist 166 into the space 164 in the reservoir 160. The oxygen gas 172 is introduced from the oxygen gas supply path 170 into the reservoir 160. The water mist 166 then flows into the water mist supply path 180 together with the oxygen gas 172. The water mist 166 then flows from the water mist supply path 180 into the furnace 120 together with the oxygen gas 172. The water mist 166 flows through the furnace 120 from the upstream end 120a to the downstream end 120b together with oxygen gas 172, and is ejected to the ejection pipe 128. The gallium oxide film on the substrate 112 supported by the substrate stage 126 is brought into contact with the water mist 166 and the oxygen gas 172. Oxygen atoms then diffuse into the gallium oxide film from water (H$_2$O) that constitutes the water mist 166 and from the oxygen gas 172 (O$_2$). The oxygen atoms that have diffused into the gallium oxide film enter into the oxygen vacancies in the gallium oxide film. The oxygen vacancies are filled with the oxygen atoms and hence are eliminated. Since the temperature of the gallium oxide film is high in the water mist annealing process, the oxygen vacancies in the gallium oxide film are easily filled with the oxygen atoms. Many of the oxygen vacancies in the gallium oxide film therefore are eliminated. The oxygen vacancies in the gallium oxide film thereby decrease at a great degree. The oxygen vacancies in the gallium oxide film can thereby be decreased efficiently. Thus, the gallium oxide film having few oxygen vacancies can be obtained.

In the film forming method of the second embodiment, as described above, the temperature of the substrate 112 and the gallium oxide film in the water mist annealing process is controlled to be higher than the temperature of the substrate 112 in the film forming process. In the film forming process, since the temperature of the substrate 112 is low, the gallium oxide film can be epitaxially grown at a high film forming rate. The gallium oxide film can thus be formed within a short time. In the water mist annealing process, since the temperature of the substrate 112 and the gallium oxide film is high, the oxygen atoms easily enter into the oxygen vacancies in the gallium oxide film. The gallium oxide film having a high crystallinity can therefore be obtained. As such, this manufacturing method enables a gallium oxide film having a high crystallinity to be formed within a short time.

As mentioned above, the film forming method in the second embodiment enables a gallium oxide film having few oxygen vacancies to be formed. Characteristics of the gallium oxide film can thus be controlled accurately.

In the second embodiment, the solution mist 146 containing the dopant material (ammonium fluoride) is supplied to the surface of the substrate 112 in the film forming process. The dopants (fluorine) are thus captured into the gallium oxide film, and the gallium oxide film of an n-type is formed. Since the temperature of the substrate 112 and the gallium oxide film in the film forming process is low, the dopants are easily captured into the gallium oxide film. Therefore, this film forming method enables a gallium oxide film having a high dopant concentration to be formed.

In the film forming method in the second embodiment, the film forming process and the water mist annealing process are performed in a same furnace 120. The gallium oxide film is thus not brought into contact with the atmosphere external to the furnace 120 during transition from the film forming process to the water mist annealing process. This can prevent unintended atoms from entering into the oxygen vacancies.

In the film forming method in the second embodiment, fluorine is used as the donors. Fluorine belongs to Group 17 and easily enters into oxygen sites. As such, if one of Group 17 elements is used as donors, the growing of a gallium oxide film makes it easier for the donors to enter into the oxygen sites. Group 15 elements also easily enter into the oxygen sites similarly to Group 17 elements.

In the above-mentioned film forming method in the second embodiment, the water mist 166 and the oxygen gas 172 are not supplied into the furnace 120 during the film forming process. However, at least one of the water mist 166 and the oxygen gas 172 may be supplied into the furnace 120 during the film forming process. In other words, at least one of the water mist 166 and the oxygen gas 172 may be supplied continuously into the furnace 120 from the film forming process through the water mist annealing process. It should be noted that, since the temperature of the substrate 112 in the film forming process is relatively low, the oxygen atoms are difficult to be captured from the water mist 166 and/or the oxygen gas 172 into the gallium oxide film in the film forming process. In other words, in the film forming process, the supply of the water mist 166 and/or the oxygen gas 172 into the furnace 120 does not much contribute to decreasing the oxygen vacancies. However, in the water mist annealing process that takes place after the film forming process, the oxygen vacancies can be decreased by filling the vacancies with oxygen atoms.

Third Embodiment

Figure 3:
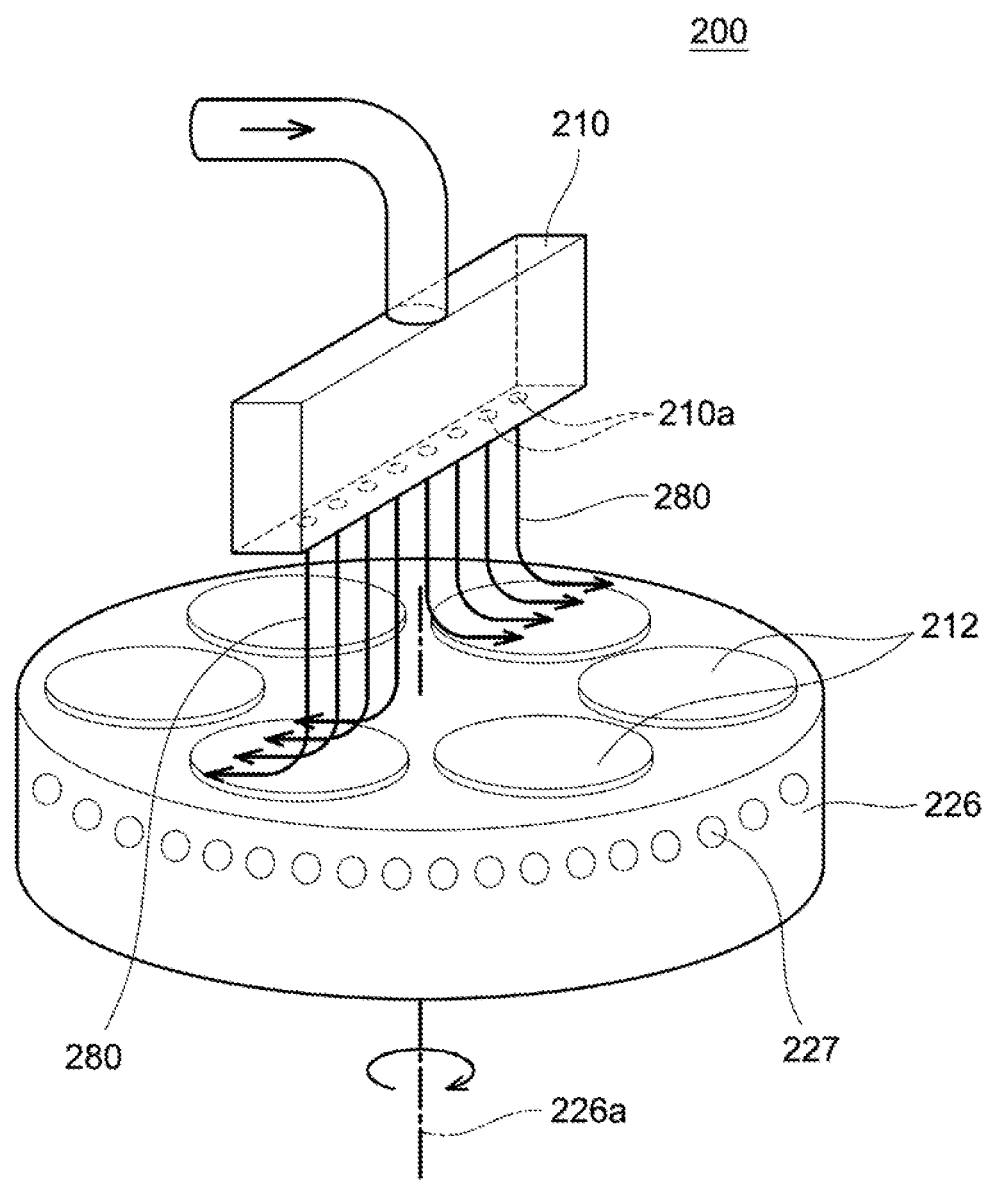
FIG. 3 is a diagram showing a configuration of a film forming apparatus in a third embodiment.

FIG. 3 shows a film forming apparatus 200 in a third embodiment. The film forming apparatus in the third embodiment is configured to discharge mist or gas from a nozzle 210 toward a plurality of substrates 212. In the third embodiment, description of devices configured to supply the mist or gas (e.g., a reservoir or a gas supply source) will be omitted.

The film forming apparatus in the third embodiment includes a substrate stage 226 configured to have the plurality of substrates 212 mounted thereon. A heater 227 configured to heat the substrates 212 is arranged within the substrate stage 226. The plurality of substrates 212 is disposed around a central axis 226a of the substrate stage 226. The substrate stage 226 rotates about the central axis 226a. The nozzle 210 is disposed above the substrate stage 226. The nozzle 210 and the substrate stage 226 are arranged in a furnace. The nozzle 210 has a rectangular parallelepiped shape elongated in one direction. A plurality of discharge ports 210a aligned along a line is formed at a lower surface of the nozzle 210. As shown by arrows 280, the mist or gas discharged downwards from the discharge ports 210a of the nozzle 210 can be applied to an entirety of the substrate stage 226 in a diameter direction of the stage 226. When the mist or gas is discharged from the nozzle 210 with the substrate stage 226 rotating, the mist or gas is applied to all of the substrates 212 on the substrate stage 226. When the substrate stage 226 is rotated at such a high speed that a moving speed of a part of the stage where a moving speed of the substrates 212 is highest becomes higher than a discharge speed of the mist or gas, a laminar flow of the gas is generated along surfaces of the substrates 212. The mist or gas flows along the laminar flow, and then the entirety of the surface of each substrate 212 is uniformly processed. Alternatively, the substrate stage 226 may be rotated at a low speed, and the laminar flow of gas may not be generated.

Next, a film forming method using the film forming apparatus 200 will be described. Here, substrates constituted of a single crystal of β-gallium oxide are used as the substrates 212. A β-gallium oxide semiconductor film is epitaxially grown on each substrate 212. An aqueous solution containing water and a gallium compound (e.g., gallium chloride) dissolved in the water is used as a solution for the solution mist. Further, β-carboxyethyl germanium sesquioxide (($GeCH_2CH_2COOH)_2O_3$) which is a dopant material has been dissolved in the solution to add germanium as dopants to the gallium oxide film. Nitrogen is used as a carrier gas. In the third embodiment, superheated water vapor (superheated steam) can also be discharged from the nozzle 210.

Firstly, the substrates 212 are placed on the substrate stage 226. After the substrates 212 have been placed, a film forming process and a water vapor annealing process are performed.

Firstly, the film forming process is performed. In the film forming process, the substrates 212 are heated with the heater 227. Here, the temperatures of the substrates 212 are controlled to be 750° C. or approximately 750° C. When the temperatures of the substrates 212 have stabilized, the substrate stage 226 is rotated, and the solution mist, the carrier gas, and the superheated water vapor are discharged from the nozzle 210. More specifically, the solution mist, the carrier gas, and the superheated water vapor are mixed at a position (not shown), and a mixture thereof is discharged from the nozzle 210. The solution mist then adheres to the surface of each substrate 212, and a β-gallium oxide film (semiconductor film) is epitaxially grown on the surface of each substrate 212. Moreover, germanium which is the dopants enters oxygen sites in each gallium oxide film, and the gallium oxide film of an n-type is grown. Although each gallium oxide film is brought into contact with the superheated water vapor, oxygen atoms are difficult to be captured from the superheated water vapor into the gallium oxide film, because the temperature of each substrate 212 is relatively low. Thus, many oxygen vacancies are formed in each gallium oxide film while each gallium oxide film is grown. After the respective gallium oxide films have been formed, discharge of the solution mist and the carrier gas is stopped. The superheated water vapor is continued to be discharged thereafter.

Next, the water vapor annealing process is performed. In the water vapor annealing process, the temperatures of the substrates 212 and the gallium oxide films are increased by the heater 227 to be 800° C. or approximately 800° C. In other words, in the water vapor annealing process, the substrates 212 and the gallium oxide films are heated at a temperature higher than the temperature of the substrates 212 in the film forming process. The superheated water vapor is discharged from the nozzle 210 continuously from the film forming process. The surfaces of the substrates 212 are brought into contact with the superheated water vapor. Oxygen atoms thus diffuse from the water vapor ($H_2O$) into each gallium oxide film. Since the temperature of each substrate 212 and gallium oxide film is higher in the water vapor annealing process, the oxygen atoms that have diffused into each gallium oxide film easily enter the oxygen vacancies in each gallium oxide film. Moreover, particularly since a partial pressure of the water vapor in the furnace is higher than a partial pressure of the water vapor in the atmosphere, oxygen atoms easily enter the oxygen vacancies. This allows the oxygen vacancies to be filled with oxygen atoms, and many oxygen vacancies to be eliminated. Since many of the oxygen vacancies are eliminated in each gallium oxide film, the oxygen vacancies in each gallium oxide film decrease at a great degree. Therefore, the gallium oxide films each having few oxygen vacancies can be obtained. In the water vapor annealing process, the water vapor may be heated with a heater (not shown).

In the film forming method in the third embodiment, as described above, the temperature of the substrates 212 and the gallium oxide films in the water vapor annealing process is controlled to be higher than the temperature of the substrates 212 in the film forming process. Since the temperature of the substrates 212 in the film forming process is low, the gallium oxide films can be epitaxially grown in the film forming process at a high film forming rate. The gallium oxide films can thus be formed within a short time. Since the temperature of the substrates 212 and the gallium oxide films is high in the water vapor annealing process, oxygen atoms easily enter the oxygen vacancies in each gallium oxide film. The gallium oxide films each having a high crystallinity can therefore be obtained. As such, this manufacturing method enables a gallium oxide film having a high crystallinity to be formed within a short time.

As mentioned above, the film forming method in the third embodiment enables a gallium oxide film having few oxygen vacancies to be formed. This also allows characteristics of the gallium oxide film to be controlled accurately.

In the third embodiment, the solution mist containing the dopant material β-carboxyethyl germanium sesquioxide) is supplied to the surfaces of the substrates 212 in the film forming process. The dopants (germanium) are thus captured into each gallium oxide film, and the gallium oxide films of an n-type are formed. Since the temperature of the substrates 212 and the gallium oxide films in the film forming process is low, the dopants are easily captured into each gallium oxide film. Therefore, this film forming method enables the gallium oxide films each having a high dopant concentration to be formed.

In the film forming method in the third embodiment, the film forming process and the water vapor annealing process are performed in a same furnace. This allows the gallium oxide films not to be brought into contact with the atmosphere external of the furnace during the transition from the film forming process to the water vapor annealing process. This can prevent unintended atoms from entering the oxygen vacancies.

β-carboxyethyl germanium sesquioxide (($GeCH_2CH_2COOH)_2O_3$) used in the third embodiment as the dopant material is an organic matter, and hence may remain in the furnace after the film forming process has taken place. However, by supplying the high-temperature water vapor into the furnace in the water vapor annealing process, the remaining organic matter is oxidized quickly and is ejected as gas to the outside of the furnace. This can prevent the organic matter from adhering to the gallium oxide film when the substrates 212 are being taken out of the furnace after the water vapor annealing process has taken place. As such, the water vapor annealing process also provides an effect of cleaning an inside of the furnace.

In the above-mentioned film forming method in the third embodiment, the superheated water vapor is discharged from the nozzle 210 in the film forming process. It should be noted that, since the temperature of the substrates 212 and the gallium oxide films is low in the film forming process, the oxygen atoms are less likely to enter from the water vapor into the gallium oxide film. The superheated water vapor therefore may not be discharged from the nozzle 210 in the film forming process. In other words, the superheated water vapor may be discharged from the nozzle 210 not in the film forming process, but in the water vapor annealing process.

Although the gallium oxide film of an n-type is grown in each of the first to third embodiments described above, a gallium oxide film of a p-type may be epitaxially grown using a solution having a dopant material including acceptors dissolved therein in another embodiment. Since oxygen vacancies function as its donors, forming the gallium oxide film doped with the acceptors can prevent the gallium oxide film from becoming an n-type.

Although the gallium oxide film is epitaxially grown in each of the first to third embodiments described above, a film constituted of another oxide may be epitaxially grown. The film to be epitaxially grown may be a semiconductor, an insulator, or a conductor. Even if any oxide material is implemented, a film having a high crystallinity can be formed by filling its oxygen vacancies with oxygen.

The film forming apparatus in each of the first to third embodiments mentioned above may have a controller added thereto, and the controller may automatically perform each process.

A relation between features in the embodiments and features in the claims will hereinafter be described. The solution mist in the first to third embodiments is an example of mist of a solution in the claims. Each of the oxygen gas, the water mist, and the water vapor in the first to third embodiments is an example of a fluid comprising oxygen atoms in the claims. The fluid may contain oxygen atoms at a molar concentration higher than that of an atmosphere.

Some of the features characteristic to the technology disclosed herein will be listed below. It should be noted that the respective technical elements are independent of one another, and are useful solely or in combinations.

In the method of forming the oxide film disclosed herein as an example, the fluid may comprise at least one of oxygen gas, water vapor, and water mist.

In such a configuration, the oxygen atoms more easily enter the oxide film.

In the method of forming the oxide film disclosed herein as an example, the fluid may comprise a processing gas constituted of oxygen gas or water vapor. In this case, a partial pressure of the processing gas in the fluid may be higher than a partial pressure of the processing gas in an atmosphere.

In such a configuration, the oxygen atoms more easily enter the oxygen vacancies.

In the method of forming the oxide film disclosed herein, the oxide film may be a semiconductor.

Oxygen vacancies function as donors in an oxide semiconductor. Thus, generation of oxide vacancies tends to make the oxide semiconductor become an n-type. In such a configuration, since an oxide film with few oxygen vacancies (i.e., oxide semiconductor film) can be formed, the characteristics of the oxide film can be controlled more accurately.

In a case where the oxide film is a semiconductor, the solution may comprise a dopant material including atoms which function as dopants in the oxide film. The oxide film comprising the dopants may be epitaxially grown in the epitaxial growth of the oxide film.

In such a configuration, the oxide film (oxide semiconductor film) doped with the dopant can be formed. The dopant can more easily be doped in the oxide film when the oxide film has a lower temperature during the epitaxial growth. In such a configuration, the oxide film is epitaxially grown at the first temperature which is relatively low. This allows the dopant to be doped in the oxide film at a higher concentration.

In the method of forming the oxide film disclosed herein, the dopants may be replaceable with oxygen sites in the oxide film.

In such a configuration, since the temperature of the substrate is the first temperature (relatively low temperature) during the epitaxial growth of the oxide film, the dopants easily enter the oxygen atom sites in the oxide film. Thus, the oxide film doped with the dopant at a higher concentration can be formed.

In the method of forming the oxide film disclosed herein, the dopant may be in Group 17 or Group 15.

In the method of forming the oxide film disclosed herein, the dopants may be acceptors.

In the method of forming the oxide film disclosed herein, the epitaxial growth of the oxide film and the bringing of the oxide film into contact with the fluid may be performed in a same furnace.

In such a configuration, the oxide film can be prevented from being brought into contact with an open air (atmosphere) before the bringing of the oxide film into contact with the fluid. This can prevent unintended atoms in the open air from entering the oxygen deficiencies of the oxide film.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed.

Further, the purpose of the examples illustrated by the present description or drawings is to satisfy multiple objectives simultaneously, and satisfying any one of those objectives gives technical utility to the present disclosure.

What is claimed is:

1. A method of forming a semiconductor gallium oxide film, the method comprising:
    supplying a mist of a solution comprising a material of the gallium oxide film dissolved therein to a surface of a substrate while heating the substrate at a first temperature to epitaxially grow the gallium oxide film on the surface; and
    contacting the gallium oxide film with a fluid comprising oxygen atoms while heating the gallium oxide film at a second temperature higher than the first temperature after the epitaxial growth of the gallium oxide film,
    wherein, after contacting the gallium oxide film with the fluid, the gallium oxide film is a single-crystal.

2. The method of claim 1, wherein the fluid comprises at least one of oxygen gas, water vapor, and water mist.

3. The method of claim 1, wherein
    the fluid comprises a processing gas comprising oxygen gas or water vapor, and
    a partial pressure of the processing gas in the fluid is higher than a partial pressure of the processing gas in an atmosphere.

4. The method of claim 1, wherein a crystallinity of the gallium oxide film is improved by contacting the gallium oxide film with the fluid.

5. The method of claim 4, wherein
    the solution comprises a dopant material comprising atoms which function as dopants in the gallium oxide film, and
    the gallium oxide film comprising the dopants is epitaxially grown in the epitaxial growth of the gallium oxide film.

6. The method of claim 5, wherein the dopants are replaceable with oxygen sites in the gallium oxide film.

7. The method of claim 5, wherein the dopants are in Group 17 or Group 15.

8. The method of claim 5, wherein the dopants are acceptors.

9. The method of claim 1, wherein the epitaxial growth of the gallium oxide film and contacting the gallium oxide film with the fluid are performed in a same furnace.

10. A method of manufacturing a semiconductor device comprising a semiconductor gallium oxide film, the method comprising:
    supplying mist of a solution including a material of the gallium oxide film dissolved therein to a surface of a substrate while heating the substrate at a first temperature so as to epitaxially grow the gallium oxide film on the surface; and
    bringing the gallium oxide film into contact with a fluid comprising oxygen atoms while heating the gallium oxide film at a second temperature higher than the first temperature after the epitaxial growth of the gallium oxide film,
    wherein, after contacting the gallium oxide film with the fluid, the gallium oxide film is a single-crystal.

11. A film forming apparatus configured to form a semiconductor gallium oxide film, the apparatus comprising:
    a mist supply device configured to supply mist of a solution comprising a material of the gallium oxide film dissolved therein;
    a fluid supply device configured to supply a fluid comprising oxygen atoms;

a heater; and a controller configured to control the mist supply device, the fluid supply device, and the heater, wherein the controller is configured to:

supply the mist from the mist supply device to a surface of a substrate while heating the substrate at a first temperature by the heater so as to epitaxially grow the gallium oxide film on the surface; and supply the fluid from the fluid supply device to the gallium oxide film to bring the gallium oxide film into contact with the fluid while heating the gallium oxide film at a second temperature higher than the first temperature by the heater after the epitaxial growth of the gallium oxide film, wherein, after contacting the gallium oxide film with the fluid, the gallium oxide film is a single-crystal.

* * * * *